(12) United States Patent
Farrell et al.

(10) Patent No.: US 8,040,128 B2
(45) Date of Patent: Oct. 18, 2011

(54) SCANNING SUSCEPTOMETER

(76) Inventors: David E. Farrell, Cleveland Heights, OH (US); Christopher J. Allen, Euclid, OH (US); Gary M. Brittenham, Euclid, OH (US)

( * ) Notice: Subject to any disclaimer, the term of this patent is extended or adjusted under 35 U.S.C. 154(b) by 371 days.

(21) Appl. No.: 12/423,189

(22) Filed: Apr. 14, 2009

(65) Prior Publication Data

US 2009/0322322 A1    Dec. 31, 2009

(51) Int. Cl.
*H01L 43/06* (2006.01)
*G01N 27/72* (2006.01)

(52) U.S. Cl. ............... 324/207.2; 324/239; 600/444

(58) Field of Classification Search ............ 324/207.2, 324/207.13, 207.11, 200, 239, 228; 600/13, 600/409, 444, 445, 447
See application file for complete search history.

(56) References Cited

U.S. PATENT DOCUMENTS

| | | | |
|---|---|---|---|
| 7,047,059 B2 * | 5/2006 | Avrin et al. | 600/409 |
| 7,650,178 B2 * | 1/2010 | Scheffler | 600/424 |
| 2003/0178995 A1 * | 9/2003 | Peshkovsky et al. | 324/307 |
| 2009/0195249 A1 * | 8/2009 | DeMeester et al. | 324/318 |
| 2010/0102813 A1 * | 4/2010 | Schulz et al. | 324/309 |

* cited by examiner

*Primary Examiner* — Hoai-An D Nguyen
(74) *Attorney, Agent, or Firm* — Kraguljac & Kalnay, LLC

(57) ABSTRACT

According to one embodiment, an apparatus comprises a magnet assembly to produce a static magnetic field and a set of high-$T_c$ flux transformers to detect a flux change from an item when the item is subjected to the static magnetic field produced by the magnet assembly and to produce a current based on the flux change. Additionally, the apparatus comprises a set of magnetoresistive sensors to detect a field produced by a current produced in the set of high-$T_c$ flux transformers and a scanning mechanism to produce cyclic relative motion between the apparatus and the item. Furthermore, the apparatus comprises a magnetic shield to shield the magnetoresistive sensors, where the shield is an open ended cylinder made from mu-metal, where mu-metal is a very high magnetic permeability iron-nickel alloy. The apparatus additionally comprises a water interface mechanism to fill a gap between the apparatus and the item with water.

41 Claims, 5 Drawing Sheets

SCANNING SUSCEPTOMETER

FEDERAL FUNDING NOTICE

The invention was developed with federal funding supplied under Federal Grant No. RO1DK057209 provided by the National Institutes of Health. The Federal government has certain rights in the invention.

CROSS REFERENCE TO RELATED APPLICATIONS

This application claims the benefit of U.S. Provisional Application 61/124,084 filed Apr. 14, 2008, the entirety of which is herein incorporated by reference.

COPYRIGHT NOTICE

A portion of the disclosure of this patent document contains material subject to copyright protection. The copyright owner has no objection to the facsimile reproduction of the patent document or the patent disclosure as it appears in the Patent and Trademark Office patent file or records, but otherwise reserves all copyright rights whatsoever.

BACKGROUND

Magnetism is a fundamental physical property of matter. Matter has measurable magnetic characteristics resulting from an electronic structure of constituent atoms and molecules. When a material is in a steadily applied magnetic field, the material responds with an induced magnetic field that can be measured. The measurement of this magnetic response may be referred to as magnetic susceptibility. The magnetic susceptibility of a material is determined by the strength of the magnetic response induced in the material by application of a magnetic field.

Susceptometers have been developed as a non-invasive method of measuring the magnetic susceptibility of a material. A susceptometer applies a magnetic field to induce a response from the material. This response is evaluated by recording the magnetic flux that the material produces. The susceptometer provides information about the nature of the material based on the evaluation of the magnetic flux. This information is used, for example, to measure hepatic iron stores in patients with iron overload.

BRIEF DESCRIPTION OF THE DRAWINGS

The accompanying drawings, which are incorporated in and constitute a part of the specification, illustrate various example systems, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Figure 1:
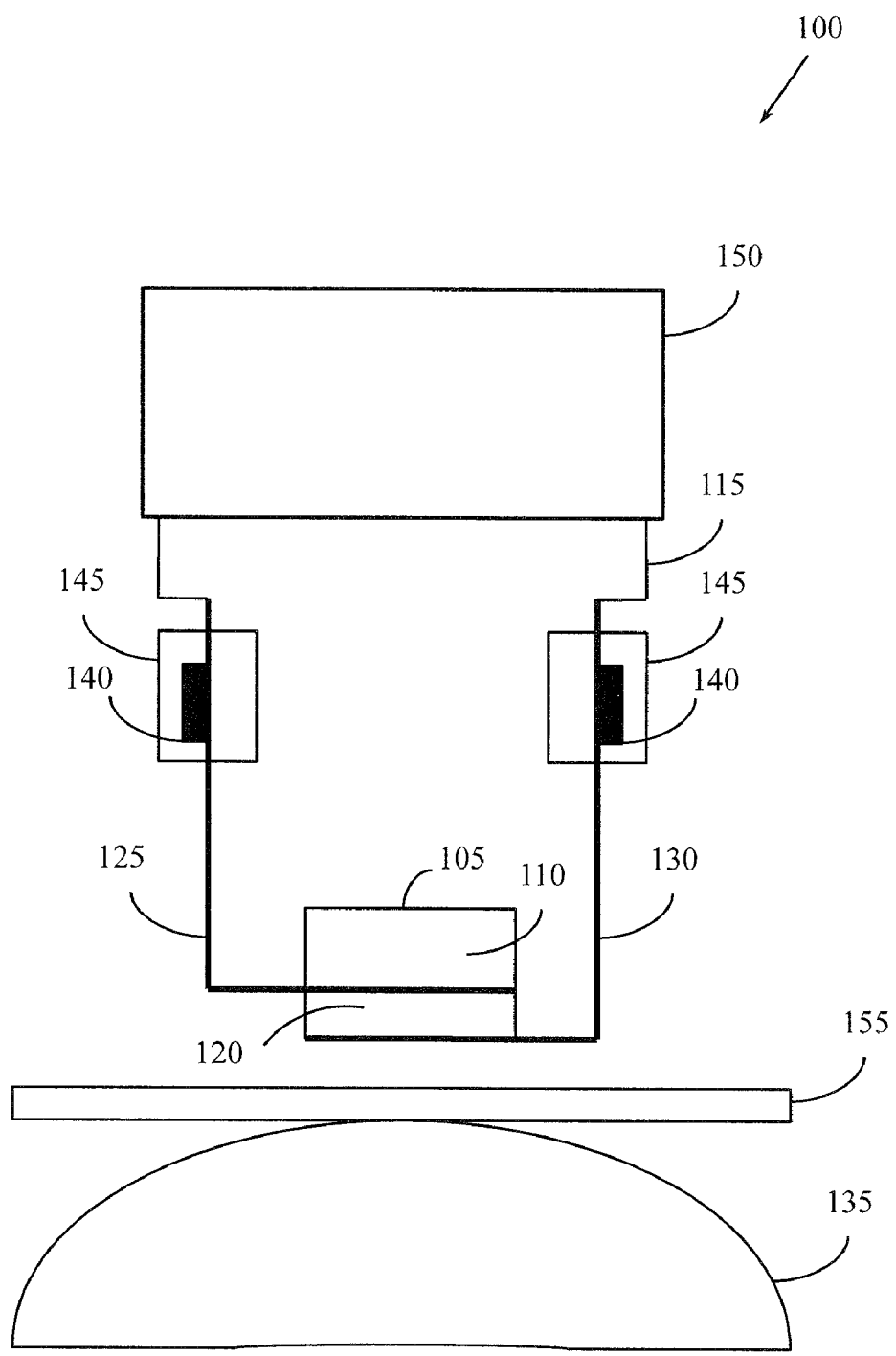
FIG. 1 illustrates an example scanning apparatus.

While magnetic susceptibility can be measured using susceptometers that include low temperature superconducting elements, the susceptometer described herein provides high quality sensitivity, signal to noise ratio (SNR), and other advantages while employing higher temperature superconducting elements. The described susceptometer can be implemented as a superconducting scanning high temperature susceptometer (HTS).

The susceptometer replaces liquid-helium cooled superconducting elements with liquid nitrogen cooled high-$T_c$ superconductor elements and/or elements that can function without cooling. These elements facilitate making a relatively small device that produces a strong static magnetic field with high quality SNR. Additionally, the device can be brought in close proximity to a body to be studied. Since the device is relatively small, the device can be moved with respect to a body to be studied. For example, the device may be moved back and forth horizontally over a body. The scanning susceptometer facilitates replacing a conventional fixed low-$T_c$ susceptometer that operates as a magnetometer, into a mobile scanning high-$T_c$ susceptometer that operates as second order planar gradiometer.

The susceptometer applies a magnetic field to a material to induce a magnetic response in the material. The response can be measured to provide information about the nature of the material. This information can be exploited to measure a material of interest that is sequestered inside another body, even when the material of interest produces a weak magnetic field. In one example, the material of interest may be iron and the sequestering body may be a liver. The property to be studied may be the iron concentration in the liver. In another example, the material of interest may be cells and the sequestering body may be a human or other animal body. The property to be studied may be cell density. In different examples a diagnosis may be made based, at least in part, on the property studied. Thus, the susceptometer can apply high temperature superconductivity for widespread clinical utility.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Computer-readable medium", as used herein, refers to a medium that stores signals, instructions and/or data. A computer-readable medium may take forms, including, but not limited to, non-volatile media, and volatile media. Non-volatile media may include, for example, optical disks, magnetic disks, and so on. Volatile media may include, for example, semiconductor memories, dynamic memory, and so on. Common forms of a computer-readable medium may include, but are not limited to, a floppy disk, a flexible disk, a hard disk, a magnetic tape, other magnetic medium, an ASIC, a CD, other optical medium, a RAM, a ROM, a memory chip or card, a memory stick, and other media from which a computer, a processor or other electronic device can read.

"Logic", as used herein, includes but is not limited to hardware, firmware, software in execution on a machine, and/or combinations of each to perform a function(s) or an action(s), and/or to cause a function or action from another logic, method, and/or system. Logic may include a software controlled microprocessor, a discrete logic (e.g., ASIC), an analog circuit, a digital circuit, a programmed logic device, a memory device containing instructions, and so on. Logic may include one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

FIG. 1 illustrates one embodiment of an apparatus 100 that can be used at least as part of a susceptometer. In one embodiment, the apparatus 100 is a scanning HTS apparatus. The apparatus 100 includes a magnet assembly 105 to produce a static magnetic field. In an illustrative instance, the magnet assembly 105 produces a magnetic field of at least 0.5 T. According to one embodiment, the magnetic assembly 105 includes two permanent magnets 110. For example, the two permanent magnets 110 are high strength rare-earth (NdFeB) magnets. In an alternative embodiment, the apparatus 100 includes an aluminum block 115. The magnetic assembly 105 can be housed in a vacuum space in the aluminum block 115.

The apparatus 100 also includes a set of high-$T_c$ flux transformers 125, 130. The transformers 125, 130 detect a flux change from an item 135 when the item is subjected to the static magnetic field produced by the magnet assembly 105. The item can be a human body, an animal body, etc. Additionally, the transformers 125, 130 produce a current based on a flux change. In one embodiment, the set of transformers 125, 130 includes two transformers fabricated from a flexible superconducting film of YCBO (e.g., $Y_1B_{a2}Cu_3O_{7-\delta}$). The transformers 125, 130 can be configured to detect flux change when cooled to at least a high-$T_c$ temperature. For example, the high-$T_c$ temperature is about 77K.

In one illustrative instance, the set of transformers 125 and 130 include a large (L) transformer 125 and a small (S) transformer 130. The L transformer 125 and S transformer 130 can mount directly beneath the magnetic assembly 105. The transformers 125, 130 can take a flux charge and transport the flux charge to a location for measurement. In one example, a measurement can be made for an iron concentration in a human liver. The human liver can be injected with an overlay material. The overlay material can be targeted to a right lobe of the liver. The L transformer 125 produces an estimate of iron concentration with relatively low sensitivity. The S transformer 130 produces an estimate of iron concentration with a relatively high sensitivity. The high sensitivity facilitates measuring a very weak (e.g., $10^{-6}$ to $10^{-7}$ Si units) response for susceptibility. The estimates of the L transformer 125 and S transformer 130 can be used to determine the iron concentration.

A set of magnetoresistive (MR) sensors 140 are also included in the apparatus 100. The MR sensors 140 detect a field produced by a current produced in the set of high-$T_c$ flux transformers 125, 130. Example systems may employ anisotropic MR sensors. According to one embodiment, the set of MR sensors 140 includes five sensors. Two sensors are used to acquire signal and three sensors are used to remove unwanted signals due to magnetic field changes from external sources. A magnetic shield 145 can be part of the apparatus 100. The magnetic shield 145 shields the MR sensors 140 and is an open ended cylinder made from mu-metal. The mu-metal is a very high magnetic permeable iron-nickel alloy.

Further, the apparatus 100 comprises a scanning mechanism 150 that produces cyclic relative motion between the apparatus 100 and an item 135 for scanning. In one implementation, the scanning mechanism 150 produces a cyclic relative motion between the apparatus 100 and the item 135 being scanned. In this implementation, the scanning mechanism 150 moves the apparatus 100 back and forth with an amplitude of 6.35 cm at 0.25 Hz. The 6.35 cm amplitude yields a 12.7 cm path. This movement narrows the effective instrumental bandwidth and facilitates filtering out thermal and other disturbances. The movement produces time dependant currents in transformers. The currents in the transformers produce magnetic fields that are detected by MR sensors 140 and generate a varying voltage signal. Thus, the scanning facilitates operating the apparatus 100 as a planar gradiometer. One of ordinary skill in the art will appreciate that other periods and other path lengths may be employed.

Also included in the apparatus 100 is a water interface mechanism 155 that fills a gap between the apparatus 100 and the item 135 being scanned with water. A bag, for example a water bellow, can reside between the apparatus and the item 135. The water interface mechanism 155 ensures that there is either water or tissue between the sensor and the item 135 from which an induced magnetic field is being sensed. Therefore, the apparatus 100 can be used to scan an item 135 and produce accurate measurements.

Figure 2:
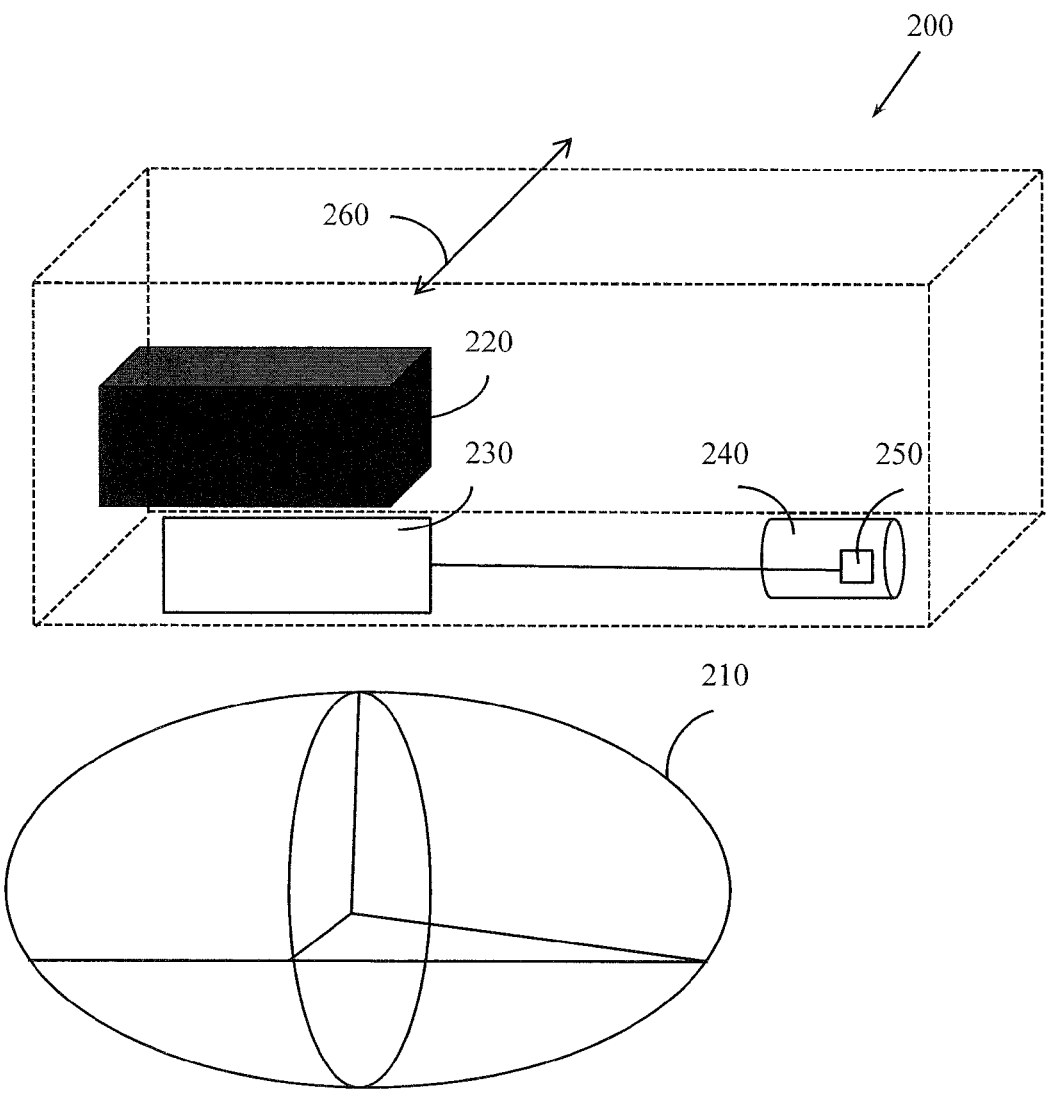
FIG. 2 illustrates a lateral view of example scanning apparatus.

FIG. 2 illustrates one embodiment of an apparatus 200 that shares functionality of the apparatus 100 of FIG. 1. In one example, the apparatus 200 may perform a lateral scan of a standard ellipsoid 210. The standard ellipsoid 210 may represent, for example, the right lobe of the liver. One embodiment of the apparatus 200 may include a magnet assembly 220, high-$T_c$ flux transformer 230, mu-metal shielding cylinder 240 and MR sensor 250. The apparatus 200 may scan the standard ellipsoid 210 back and forth as indicated by the scan direction 260. In one example, the scan direction 260 is a horizontal plane above the standard ellipsoid 210. Thus, the apparatus 200 can be used to scan the standard ellipsoid 210 and produce accurate measurements.

Figure 3:
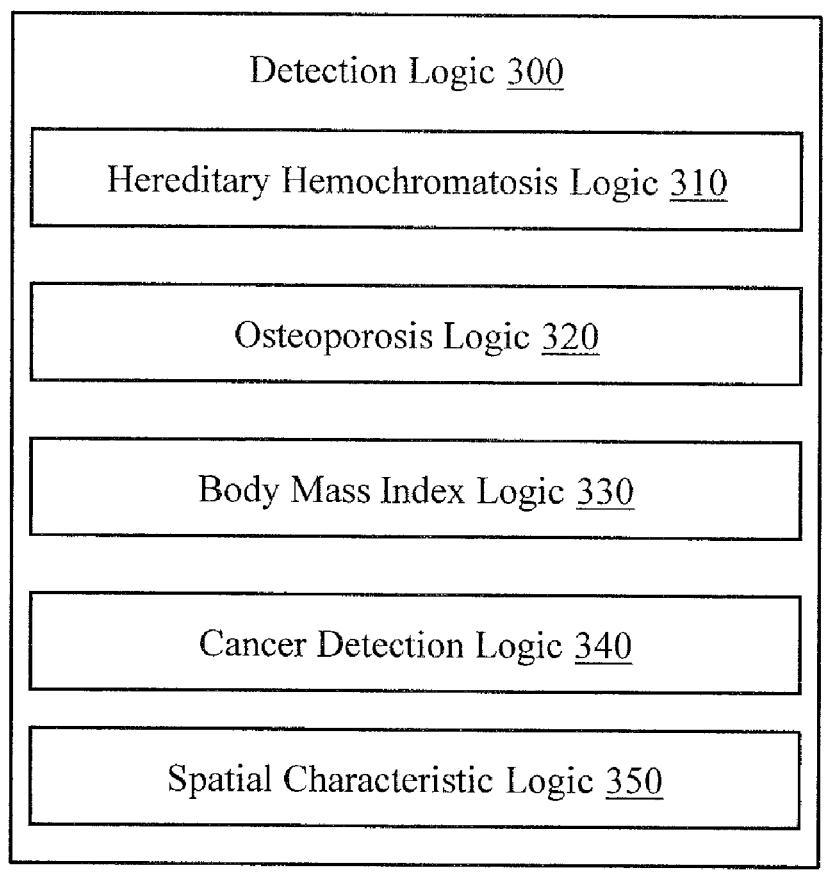
FIG. 3 illustrates an example detection logic associated with the example scanning apparatus.

FIG. 3 illustrates one embodiment of detection logic 300 that can be part of the apparatus 100 of FIG. 1. In one embodiment, detection logic 300 includes hereditary hemochromatosis detection logic 310 to provide a signal concerning the likelihood that the human body is affected by hereditary hemochromatosis. Hereditary hemochromatosis is a genetic disease that produces a form of iron overload. The signal is based, at least in part, on a measure of iron stores in the liver of the human body as indicated by diamagnetic susceptibility of the liver in the human body.

The detection logic 300 can provide other signals in addition to signals related to iron store measurement. In one embodiment, the detection logic 300 includes osteoporosis detection logic 320 to provide a signal concerning the likelihood that the human body is affected by osteoporosis. The signal is based, at least in part, on a measure of bone density as indicated by diamagnetic susceptibility. Further, the detection logic 300 may also measure body density in an attempt to characterize a bone-dominated body from a fat-dominated body. This may be employed by a body mass index (BMI) logic 330 to provide a signal concerning the BMI of the human body. The signal is based, at least in part, on a measure of tissue density as indicated by diamagnetic susceptibility.

With a further embodiment, the detection logic 300 may include a cancer detection logic 340 to provide a signal concerning the likelihood that the human body includes a cancer tumor. The signal is based, at least in part, on a measure of tumor density as indicated by diamagnetic susceptibility. The detection logic 300 may also include a spatial characteristic logic 350 to provide a set of spatial data that characterizes at least one spatial attribute of item 135 of FIG. 1. It is to be appreciated that other forms of logic can integrate with the detection logic to provide signals associated with diamagnetic susceptibility.

Methods described herein may be integrated upon a computer-readable medium storing computer-executable instructions that when executed by a computer cause the computer to perform a method.

Figure 4:
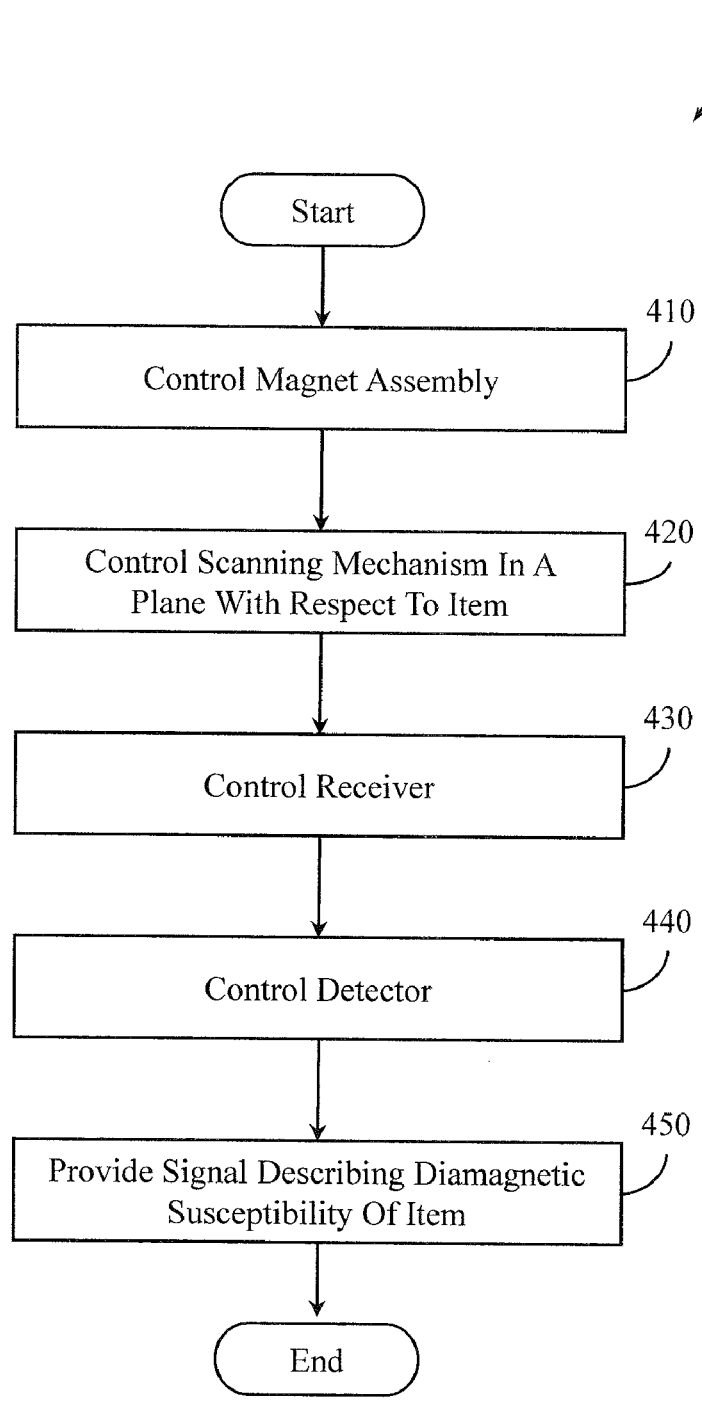
FIG. 4 illustrates an example method associated with controlling the example scanning apparatus.

FIG. 4 illustrates an example method 400 for providing a signal describing diamagnetic susceptibility of an item. Method 400 may include, at 410, controlling the magnet assembly to produce a static magnetic field. In one example, controlling the magnetic assembly produces a static magnetic field of at least 0.5 T. The apparatus 100 controls the scanning mechanism at 420 by moving the scanning mechanism in a plane with respect to the item. The moving produces cyclic relative motion between the magnetic assembly and the item. For example, the scanning mechanism may be moved back and forth in a horizontal plane above the item. The movement of the scanning mechanism produces cyclic relative motion between the magnet assembly and the item of 0.25 Hz.

Method 400 includes, at 430, controlling a receiver to receive a current that is a function of a flux change in the item as a response to the static magnetic field produced by the magnet assembly. Further, at 440, a detector is controlled to detect a transverse magnetic field produced by the current.

The method 400 further includes providing a signal describing the diamagnetic susceptibility of the item at 450. The signal provided at 450 may describe the diamagnetic susceptibility of the item as a differential measurement. The differential measurement is a function of a difference in susceptibility between the item and that of water.

The signal provided at 450 may also describe the diamagnetic susceptibility of the item as a function of the density of the item. There is a close connection between diamagnetic susceptibility and density. The magnitude of the diamagnetic susceptibility is directly proportional to the mean square distance of electrons from their nucleus. Increased density confines electrons to a smaller region of space, which reduces the mean square distance of electrons from their nucleus. Therefore, susceptibility increases with density.

The signal describing the diamagnetic susceptibility at 450 can be used to facilitate magnetic susceptibility diagnostics. For example, the signal may concern a likelihood that the human body is affected by hereditary hemochromatosis. The signal is based, at least in part, on a measure of iron stores in the liver of the human body as indicated by the diamagnetic susceptibility. In another example, the signal may concern a likelihood that the human body is affected by osteoporosis. The signal is based, at least in part on a measure of bone density of the human body as indicated by the diamagnetic susceptibility. The signal may also concern the BMI of the human body. The signal is based, at least in part, on a measure of tissue density of the human body as indicated by the diamagnetic susceptibility.

With a further example, the signal may concern the likelihood that the human body includes a cancer tumor. The signal is based, at least in part, on a measure of tumor density of the human body as indicated by the diamagnetic susceptibility. The signal may also concern the iron concentration in liver tissue. The signal is based, at least in part, on the diamagnetic susceptibility of liver tissue. It is also possible that method 400 includes providing a set of spatial data that characterizes at least one spatial attribute of the item. Thus, method 400 is able to describe diamagnetic susceptibility as a signal and exploit that signal diagnostically.

Figure 5:
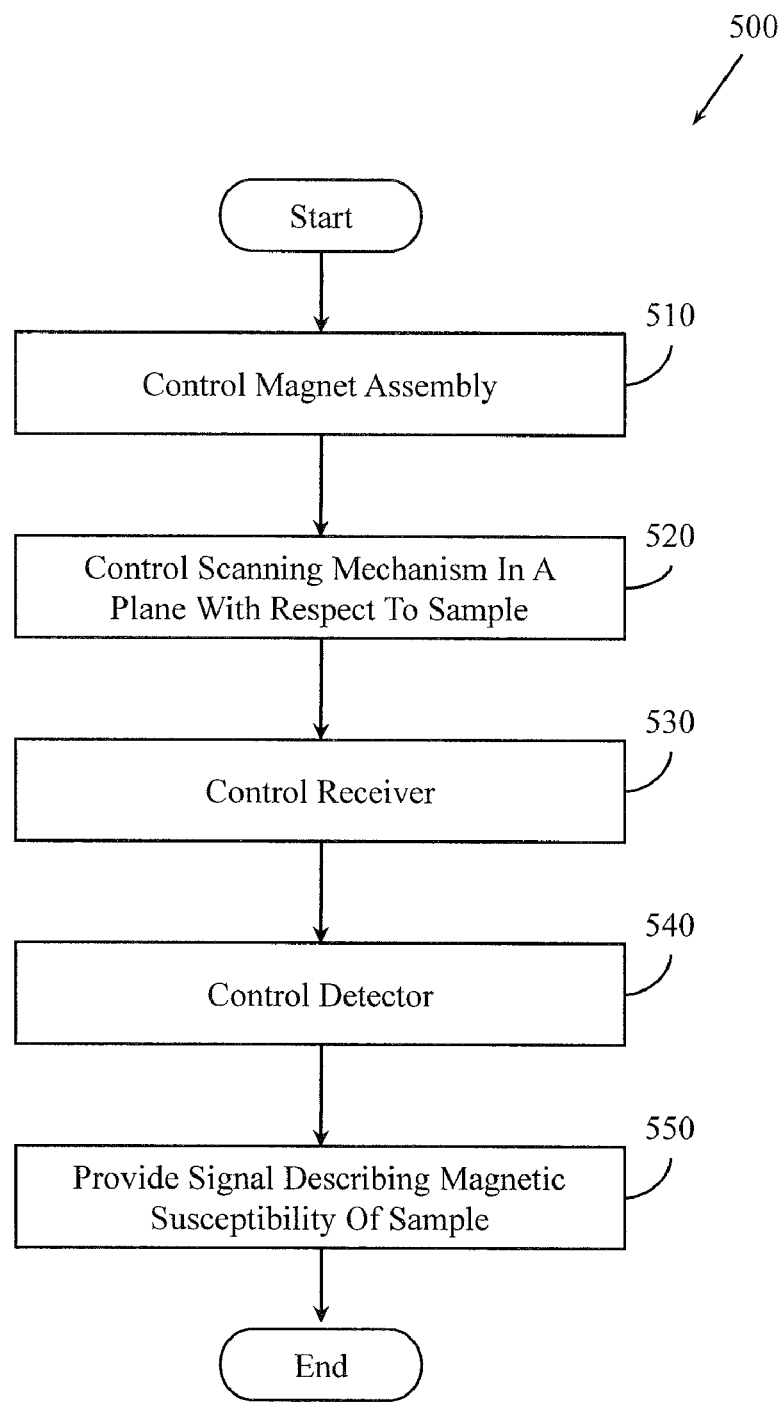
FIG. 5 illustrates an example method associated with controlling the example scanning apparatus.

FIG. 5 illustrates an example method 500 for providing a signal describing in vitro magnetic susceptibility of a sample. Method 500 may include, at 510, controlling the magnet assembly to produce a static magnetic field. In one example, controlling the magnetic assembly produces the static magnetic field of at least 0.5 T.

The method 500 includes controlling a scanning mechanism, at 520, by moving the scanning mechanism in a pattern with respect to a sample, where the sample is located in a liquid. The sample may be biological tissue removed from a host. The liquid may be water. The scanning mechanism produces cyclic relative motion between the magnet assembly and the sample. The motion may be of 0.25 Hz. The pattern may be horizontal and 1 mm above the surface of a liquid in which the sample is located.

Method 500 may include, at 530, controlling a receiver to receive a current that is a function of a flux change in the sample as a response to the static magnetic field produced by the magnet assembly. Further, at 540, a detector is controlled to detect a transverse magnetic field produced by the current. Method 500, at 550, can provide a signal based on the transverse magnetic field at 540, to describe the magnetic susceptibility of the sample.

The signal produced at 550 is, based, at least in part, on a susceptibility of the liquid, a susceptibility of the sample in the liquid and a susceptibility of the sample in air. The signal produced at 550 may be associated with, for example, hereditary hemochromatosis, osteoporosis, body mass index, tumor density or iron concentration in the sample.

In one embodiment, method 500 provides a way to measure the magnetic susceptibility of biological tissue submerged in a liquid. The biological tissue is in vitro, which means that the biological tissue has been removed from a host. A problem associated with in vitro tissue susceptibility is that the biological tissue contains fluids, a fraction of which are lost on removal from the host. This alters the susceptibility of the biological tissue. The biological tissue can be reproduced into a "wet" state by immersing the biological tissue in water, drying the biological tissue, and then re-immersing the biological tissue in water. The "wet" state of the biological tissue corresponds closely to the original body tissue condition, therefore method 500 provides a way to accurately measure the magnetic susceptibility of biological tissue submerged in liquid.

While example apparatus and methods have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the invention is not limited to the specific details, the representative apparatus, and illustrative examples shown and described. Thus, this application is intended to embrace alterations, modifications, and variations that fall within the scope of the appended claims.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

To the extent that the phrase "one or more of, A, B, and C" is employed herein, (e.g., a data store configured to store one or more of, A, B, and C) it is intended to convey the set of possibilities A, B, C, AB, AC, BC, and/or ABC (e.g., the data store may store only A, only B, only C, A&B, A&C, B&C, and/or A&B&C). It is not intended to require one of A, one of B, and one of C. When the applicants intend to indicate "at least one of A, at least one of B, and at least one of C", then the phrasing "at least one of A, at least one of B, and at least one of C" will be employed.

What is claimed is:

1. An apparatus, comprising:
   a magnet assembly to produce a static magnetic field;
   a set of high-$T_c$ flux transformers to detect a flux change from an item when the item is subjected to the static magnetic field produced by the magnet assembly and to produce a current based on the flux change;
   a set of magnetoresistive sensors to detect a field produced by a current produced in the set of high-$T_c$ flux transformers;
   a scanning mechanism to produce cyclic relative motion between the apparatus and the item;
   a magnetic shield to shield the magnetoresistive sensors, where the shield is an open ended cylinder made from mu-metal, where mu-metal is a very high magnetic permeability iron-nickel alloy; and
   a water interface mechanism to fill a gap between the apparatus and the item with water.

2. The apparatus of claim 1, where the set of high-$T_c$ flux transformers detect flux change when cooled to at least a high-$T_c$ temperature.

3. The apparatus of claim 2, where the high-$T_c$ temperature is about 77K.

4. The apparatus of claim 1, where the magnet assembly includes two NdBFe magnets.

5. The apparatus of claim 1, where the magnet assembly produces a static magnetic field of at least 0.5 T.

6. The apparatus of claim 1, where the apparatus includes an aluminum block and where the magnet assembly is housed in a vacuum space in the aluminum block.

7. The apparatus of claim 1, where the set of high-$T_c$ flux transformers includes two transformers fabricated from a flexible superconducting film of YCBO.

8. The apparatus of claim 1, where the set of magnetoresistive sensors includes five sensors, where two of the five sensors are used to acquire signal and where three of the five sensors are used to remove unwanted signals due to magnetic field changes from external sources.

9. The apparatus of claim 1, where the scanning mechanism produces a cyclic relative motion between the apparatus and the item of 0.25 Hz.

10. The apparatus of claim 9, where the scanning mechanism moves the apparatus horizontally with respect to the item.

11. The apparatus of claim 1, where the item is a human body.

12. The apparatus of claim 11, including a hereditary hemochromatosis detection logic to provide a signal concerning the likelihood that the human body is affected by hereditary hemochromatosis, where the signal is based, at least in part, on a measure of iron stores in the liver of the human body as indicated by diamagnetic susceptibility.

13. The apparatus of claim 11, including an osteoporosis detection logic to provide a signal concerning the likelihood that the human body is affected by osteoporosis, where the signal is based, at least in part, on a measure of bone density as indicated by diamagnetic susceptibility.

14. The apparatus of claim 11, including a body mass index logic to provide a signal concerning the body mass index of the human body, where the signal is based, at least in part, on a measure of tissue density as indicated by diamagnetic susceptibility.

15. The apparatus of claim 11, including a cancer detection logic to provide a signal concerning the likelihood that the human body includes a cancer tumor, where the signal is based, at least in part, on a measure of tumor density as indicated by diamagnetic susceptibility.

16. The apparatus of claim 11, including a spatial characteristic logic to provide a set of spatial data that characterizes at least one spatial attribute of the item.

17. The apparatus of claim 11, including an iron stores logic to provide a signal concerning iron concentration in liver tissue, where the signal is based, at least in part, on diamagnetic susceptibility of liver tissue.

18. The apparatus of claim 1, where the item is an animal body.

19. A computer-readable medium storing computer-executable instructions that when executed by a computer cause the computer to perform a method, the method comprising:
   controlling a magnet assembly to produce a static magnetic field;
   controlling a scanning mechanism to produce cyclic relative motion between the magnet assembly and an item by moving the scanning mechanism in a plane with respect to the item;
   controlling a receiver to receive a current that is a function of a flux change in the item as a response to the static magnetic field produced by the magnet assembly;
   controlling a detector to detect a transverse magnetic field produced by the current; and
   providing a signal describing diamagnetic susceptibility of the item.

20. The computer-readable medium of claim 19, where controlling the magnet assembly produces the static magnetic field of at least 0.5 T.

21. The computer-readable medium of claim 19, where controlling the scanning mechanism produces cyclic relative motion between the magnet assembly and the item of 0.25 Hz.

22. The computer-readable medium of claim 19, where the plane is horizontal.

23. The computer-readable medium of claim 19, where the plane is horizontal and above the item.

24. The computer-readable medium of claim 19, where the signal describing the diamagnetic susceptibility of the item is a function of a difference in susceptibility between the item and that of water.

25. The computer-readable medium of claim 19, where the signal describing the diamagnetic susceptibility of the item is a function of the density of the item.

26. The computer-readable medium of claim 19, where the item is a human body.

27. The computer-readable medium of claim 26, where the signal concerns a likelihood that the human body is affected by hereditary hemochromatosis, where the signal is based, at least in part, on a measure of iron stores in the liver of the human body as indicated by the diamagnetic susceptibility.

28. The computer-readable medium of claim 26, where the signal concerns a likelihood that the human body is affected by osteoporosis, where the signal is based, at least in part, on a measure of bone density of the human body as indicated by the diamagnetic susceptibility.

29. The computer-readable medium of claim 26, where the signal concerns the body mass index of the human body, where the signal is based, at least in part, on a measure of tissue density of the human body as indicated by the diamagnetic susceptibility.

30. The computer-readable medium of claim 26, where the signal concerns a likelihood that the human body includes a cancer tumor, where the signal is based, at least in part, on a measure of tumor density of the human body as indicated by the diamagnetic susceptibility.

31. The computer-readable medium of claim 26, where the signal is associated with the iron concentration in liver tissue, where the signal is based, at least in part, on the diamagnetic susceptibility of liver tissue.

32. The computer-readable medium of claim 26, the method comprising providing a set of spatial data that characterizes at least one spatial attribute of the item.

33. A computer-readable medium storing computer-executable instructions that when executed by a computer cause the computer to perform a method, the method comprising:
   controlling a magnet assembly to produce a static magnetic field;
   controlling a scanning mechanism to produce cyclic relative motion between the magnet assembly and a sample by moving the scanning mechanism in a pattern with respect to the sample, where the sample is located in a liquid;
   controlling a receiver to receive a current that is a function of a flux change in the sample as a response to the static magnetic field produced by the magnet assembly;
   controlling a detector to detect a transverse magnetic field produced by the current; and
   providing a signal describing magnetic susceptibility of the sample.

34. The computer-readable medium of claim 33, where the static magnetic field is at least 0.5 T.

35. The computer-readable medium of claim 33, where the sample is biological tissue removed from a host.

36. The computer-readable medium of claim 33, where the cyclic relative motion between the magnet assembly and the sample is 0.25 Hz.

37. The computer-readable medium of claim 33, where the pattern is a horizontal plane.

38. The computer-readable medium of claim 33, where the pattern is a horizontal plane and 1 mm above the surface of a liquid in which the sample is located.

39. The computer-readable medium of claim 33, where the signal describing magnetic susceptibility of the sample located in the liquid is based on a susceptibility of the liquid, a susceptibility of the sample in the liquid and a susceptibility of the sample in air.

40. The computer-readable medium of claim 33, where the liquid is water.

41. The computer-readable medium of claim 33, where the signal is associated with hereditary hemochromatosis, osteoporosis, body mass index, tumor density or iron concentration in the sample.

* * * * *